US012801193B2

(12) United States Patent
Lin et al.

(10) Patent No.: US 12,801,193 B2
(45) Date of Patent: Nov. 17, 2026

(54) INDUSTRIAL PERSONAL COMPUTER WITH IMPROVED SSD HEAT DISSIPATION

(71) Applicant: Siemens Aktiengesellschaft, Munich (DE)

(72) Inventors: Shi Kong Lin, Chengdu (CN); Ting Li Lan, Chengdu (CN)

(73) Assignee: SIEMENS AKTIENGESELLSCHAFT, Munich (DE)

(*) Notice: Subject to any disclaimer, the term of this patent is extended or adjusted under 35 U.S.C. 154(b) by 268 days.

(21) Appl. No.: 18/721,564

(22) PCT Filed: Dec. 21, 2021

(86) PCT No.: PCT/CN2021/140170
§ 371 (c)(1),
(2) Date: Jun. 19, 2024

(87) PCT Pub. No.: WO2023/115351
PCT Pub. Date: Jun. 29, 2023

(65) Prior Publication Data
US 2025/0060799 A1 Feb. 20, 2025

(51) Int. Cl.
*H05K 7/20* (2006.01)
*G06F 1/18* (2026.01)
(Continued)

(52) U.S. Cl.
CPC ................ *G06F 1/20* (2013.01); *G06F 1/182* (2013.01); *G06F 1/184* (2013.01); *G06F 1/187* (2013.01);
(Continued)

(58) Field of Classification Search
CPC .......... H05K 7/20409–20418; H05K 7/20436; H05K 7/20454; G06F 1/18; G06F 1/187; G06F 1/20
See application file for complete search history.

(56) References Cited

U.S. PATENT DOCUMENTS 5,436,794 A 7/1995 Clemente
7,136,286 B2 * 11/2006 Chuang .............. H05K 7/20409 361/730

(Continued)

FOREIGN PATENT DOCUMENTS

CN 102858136 A 1/2013
CN 105759923 A 7/2016

(Continued)

OTHER PUBLICATIONS

Search Report for International Application No. PCT/CN2021/140170, 13 pages, Sep. 21, 2022.
Extended European Search Report, Application No. 21968502.1, 11 pages.

*Primary Examiner* — Zachary Pape
(74) *Attorney, Agent, or Firm* — Slayden Grubert Beard PLLC

(57) ABSTRACT

The disclosure relates to an industrial personal computer comprising: a main housing at least one panel of which is used as a CPU heat dissipating member, a portion of the one panel being recessed to form a pocket; a CPU, heat generated by the CPU being transferred to the CPU heat dissipating member and then dissipated directly into the ambient air; a SSD at least partially positioned in the pocket; and a SSD heat dissipating member positioned in the pocket and exposed to the ambient air, heat generated by the SSD being transferred to the SSD heat dissipating member and then (Continued)

dissipated directly into the ambient air, wherein the SSD heat dissipating member is heat isolated from the CPU heat dissipating member.

20 Claims, 6 Drawing Sheets

(51) Int. Cl.

| | |
|---|---|
| ***G06F 1/184*** | (2026.01) |
| ***G06F 1/187*** | (2026.01) |
| ***G06F 1/20*** | (2006.01) |

(52) U.S. Cl.
CPC ..... *H05K 7/20418* (2013.01); *H05K 7/20454* (2013.01)

(56) References Cited

U.S. PATENT DOCUMENTS

| | | | | |
|---|---|---|---|---|
| 8,842,437 | B2 * | 9/2014 | Chang | G06F 1/181 361/704 |
| 2008/0316706 | A1 | 12/2008 | Liu et al. | 361/697 |
| 2013/0003293 | A1 | 1/2013 | Yang | |
| 2016/0299545 | A1 | 10/2016 | May | |
| 2020/0174534 | A1 | 6/2020 | Ganta Papa Rao Bala et al. | |

FOREIGN PATENT DOCUMENTS

| | | | | | |
|---|---|---|---|---|---|
| CN | 206833330 | U | | 1/2018 | G06F 1/16 |
| CN | 111290535 | A | * | 6/2020 | G06F 1/187 |
| EP | 1333359 | B1 | | 8/2003 | G06F 1/16 |
| EP | 1591871 | A1 | | 11/2005 | |
| TW | M306344 | U | * | 2/2007 | |

* cited by examiner

INDUSTRIAL PERSONAL COMPUTER WITH IMPROVED SSD HEAT DISSIPATION

CROSS-REFERENCE TO RELATED APPLICATIONS

This application is a U.S. National Stage Application of International Application No. PCT/CN2021/140170 filed Dec. 21, 2021, which designates the United States of America, the contents of which are hereby incorporated by reference in their entirety.

TECHNICAL FIELD

The present disclosure relates to an industrial personal computer (industrial PC or IPC or industrial computer). Various embodiments of the teachings herein include industrial personal computers with improved SSD heat dissipation.

BACKGROUND

With rapid development of computer and automation technology, industrial PCs have been widely used as terminal platforms in more and more key industries, due to their stable working status, rich interface extensions and strong adaptability to harsh working environments. Often deployed in the harsh working environments with, for example, high temperature, high humidity and lots of dust, most of the traditional industrial PCs use a general industrial motherboard with various functional electronic components mounted thereon, and an aluminum (Al) housing defining an interior in which the motherboard and the electronic components are accommodated. The Al housing or a portion thereof functions as a main heat dissipating member or cooling member for dissipating heat generated by heat generating components, such as a CPU and a SSD. For example, the heat is only dissipated into ambient air via natural convection through the heat dissipating member.

However, with the housing being typically sealed from the dust and due to a fixed motherboard layout in the interior and a limited space between the motherboard and the housing, a large amount of heat generated mainly by the CPU and the SSD can't be dissipated out efficiently, which results in a much higher temperature of the housing than the ambient air. In particular, in conditions where the CPU generates much more heat than the SSD, the SSD has a poor cooling efficiency.

Moreover, taking the working environments and cooling power consumption into consideration, it is impossible or at least difficult to improve the heat dissipation efficiency by cooling down the ambient air around the industrial PCs. Therefore, using the housing as the only cooling member for both the CPU and the SSD with only natural convection around the industrial PCS, cooling for the SSD between the motherboard and the housing is inadequate and difficult.

SUMMARY

Teachings of the present disclosure address at least one of the above issues. For example, some embodiments include an industrial personal computer (100) comprising: a main housing (10) exposed to ambient air and comprising a top panel (12) and two side panels (14), the two side panels (14) extending from opposite ends of the top panel (12) in a longitudinal direction (L) to define an inverted-U-shape profile when viewed in a lateral direction (W) perpendicular to the longitudinal direction (L) and define an internal space (15), at least one panel of the top panel (12) and two side panels (14) being used as a CPU heat dissipating member (60), and a portion of the one panel being recessed into the internal space (15) to form a pocket (25); a CPU (22) accommodated in the internal space (15), heat generated by the CPU (22) being transferred to the CPU heat dissipating member (60) in a CPU heat dissipating path and dissipated directly into the ambient air from the CPU heat dissipating member (60); a SSD (24) at least partially positioned in the pocket (25); and a SSD heat dissipating member (50) positioned in the pocket (25) and exposed to the ambient air, heat generated by the SSD (24) being transferred to the SSD heat dissipating member (50) in a SSD heat dissipating path and dissipated directly into the ambient air from the SSD heat dissipating member (50), wherein the SSD heat dissipating member (50) is heat isolated from the CPU heat dissipating member (60).

In some embodiments, the SSD heat dissipating member (50) is spaced apart from the CPU heat dissipating member (60) with a gap, or the SSD heat dissipating member (50) and the CPU heat dissipating member (60) comprise surfaces contacting each other with a heat insulating member (90) interposed between the surfaces and heat isolating them from each other.

In some embodiments, the one panel comprises a panel body, the pocket (25) defining an opening (27) in the panel body of the one panel, and the SSD heat dissipating member (50) being configured to cover the opening (27).

In some embodiments, the SSD heat dissipating member (50) comprises a SSD body (52) which is shaped to be complementary to the opening (27).

In some embodiments, an outer surface (53) of the SSD body (52) of the SSD heat dissipating member (50) away from the internal space (15) is flush with is an outer surface (31) of the panel body away from the internal space (15).

In some embodiments, the panel body defines a concave corner (92) extending along the opening (27) and defined by a first corner surface (91) and a second corner surface (93) connected with each other, and the SSD body (52) of the SSD heat dissipating member (50) defines a convex edge (96) adapted to be mated with the concave corner (92) and defined by a first edge surface (95) to be pressed against the first corner surface (91) and a second edge surface (97) to face the second corner surface (93).

In some embodiments, the heat insulating member (90) is provided between the first edge surface (95) and the first corner surface (91) and the second edge surface (97) and the second corner surface (93) are spaced apart from each other, or the heat insulating member (90) is provided between the first edge surface (95) and the first corner surface (91) and between the second edge surface (97) and the second corner surface (93).

In some embodiments, the concave corner (92) is a right-angled or rounded corner and the convex edge (96) is right-angle right-angled or rounded edge.

In some embodiments, the opening (27) extends along an entire width of the one panel in the lateral direction (W) and opens at opposite ends in the lateral direction (W), or the opening (27) is a closed opening and is shaped to be trapezoidal, triangular, pentagonal, hexagonal rectangular, octagonal, oval, or circular.

In some embodiments, the heat insulating member (90) is in a form of film or coating, and the heat insulating member (90) is made of glass fiber or asbestos.

In some embodiments, the opening (27) extends along an entire width of the one panel in the lateral direction (W) and divides CPU top fins extending outwardly from the one panel away from the internal space (15) into a first set of fins and a second set of fins, and the SSD heat dissipating member (50) comprises SSD fins extending outwardly away from the internal space (15), and wherein the first set of fins and the second set of fins are symmetrical or asymmetrical with regard to the opening (27); and/or the CPU top fins and/or the SSD fins each include one or more types of fins, the type of fin being associated with parameters of the fin including an extending direction of the fin, a cross-sectional shape of the fin, a cross-sectional dimension of the fin, a spacing between adjacent fins, and the arrangement pattern of the fins.

In some embodiments, the industrial personal computer (100) further comprises a motherboard (20) which is secured to the main housing (10) within the internal space (15), the CPU (22) being secured to the motherboard (20), and the motherboard (20) being spaced apart from or in contact with a bottom wall (62) of the pocket (25) closest to the motherboard (20).

In some embodiments, the SSD (24) is secured to a motherboard (20) by means of at least one of a SSD mount (66) which extends through a mount hole (66*a*) formed in the bottom wall (62) of the pocket (25) and a fastener (68) which extends through a fastener hole (68*a*) formed in the bottom wall (62), the mount hole (66*a*) and the fastener hole (68*a*) being provided as separates holes or a single hole which is sized to receive both the SSD mount (66) and the fastener (68) or to receive at least a portion of the SSD (24); or the SSD (24) is entirely accommodated in and secured to the pocket (25) with an electrically connecting member extending through the pocket (25) to electrically connect the SSD (24) to an electronic component on the motherboard (20).

In some embodiments, the SSD (24) and a surface of the pocket (25) adjacent to the SSD (24) are heat isolated from each other by a further heat insulating member interposed therebetween or by a gap (G) separating them apart from each other.

In some embodiments, the SSD heat dissipating member (50) is secured to an intermediate component which in turn is secured to the SSD (24), or the SSD heat dissipating member (50) is secured to the motherboard (20) with a connecting member which extends through the pocket (25).

In some embodiments, the SSD heat dissipating member (50) is secured to the CPU heat dissipating member (60).

In some embodiments, the SSD heat dissipating member (50) is secured to the bottom wall (62) and/or a side wall of the pocket (25) connecting the bottom wall (62) with a panel body of the one panel.

In some embodiments, one or more studs extend from the bottom wall (62), and the SSD heat dissipating member (50) being secured to the studs with a fastener.

In some embodiments, the CPU heat dissipating path further comprises a CPU heat transferring member (30) which is configured to be sandwiched and compressed between the CPU (22) and the main housing (10) so as to transfer the heat from the CPU (22) to the main housing (10); and the SSD heat dissipating path further comprising a SSD heat transferring member (40) which is configured to be sandwiched and compressed between the SSD (24) and the SSD heat dissipating member (50) so as to transfer the heat from the SSD (24) to the SSD heat dissipating member (50), wherein the SSD heat transferring member (40) and the CPU heat transferring member (30) are made of heat conductive elastomer.

In some embodiments, the one panel is the top panel (12), the panel (12) and two side panels (14) are formed as an integral or formed separately and attached to each other, and the entire main housing (10) is used as the CPU heat dissipating member (60).

BRIEF DESCRIPTION OF THE DRAWINGS

The foregoing summary, as well as the following detailed description of an example embodiment of the teachings herein, will be better understood when read in conjunction with the appended drawings, in which there is shown the example embodiment for the purposes of illustration. It should be understood, however, that the scope of the disclosure is not limited to the precise arrangements shown. In the drawings.

DETAILED DESCRIPTION

Figure 1:
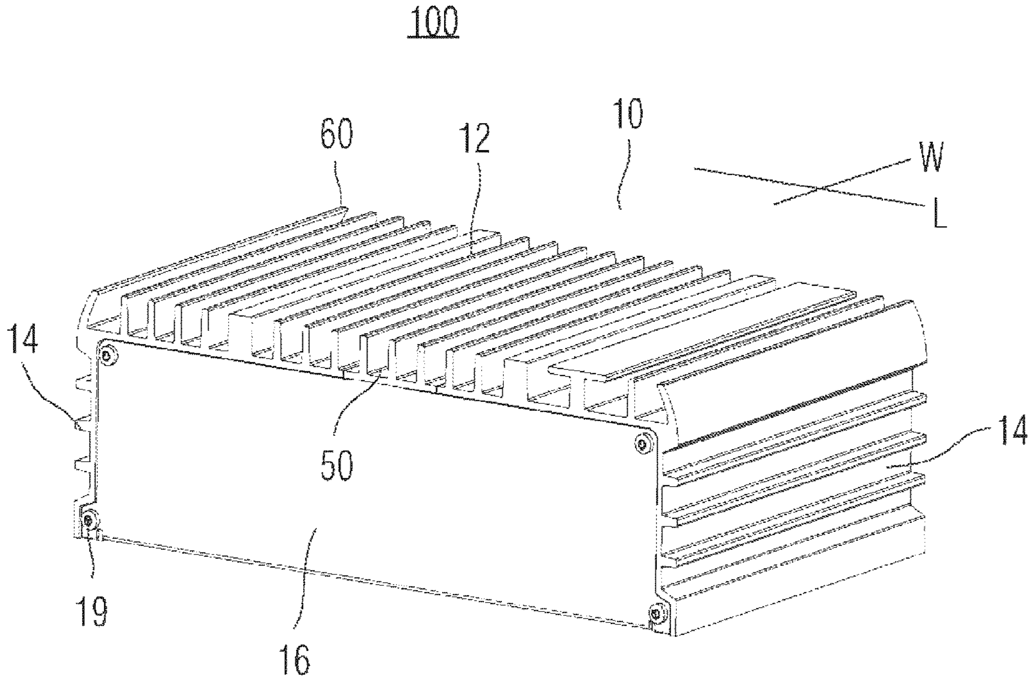
FIG. 1 is an assembled view illustrating an example industrial personal computer (industrial PC) incorporating teachings of the disclosure.

The teachings of the present disclosure include an industrial personal computer comprising: a main housing exposed to ambient air and comprising a top panel and two side panels, the two side panels extending from opposite ends of the top panel in a longitudinal direction to define an inverted-U-shape profile when viewed in a lateral direction perpendicular to the longitudinal direction and define an internal space, at least one panel of the top panel and two side panels being used as a CPU heat dissipating member, and a portion of the one panel being recessed into the internal space to form a pocket; a CPU accommodated in the internal space, heat generated by the CPU being transferred to the CPU heat dissipating member in a CPU heat dissipating path and dissipated directly into the ambient air from the CPU heat dissipating member; a SSD at least partially positioned in the pocket; and a SSD heat dissipating member positioned in the pocket and exposed to the ambient air, heat generated by the SSD being transferred to the SSD heat dissipating member in a SSD heat dissipating path and dissipated directly into the ambient air from the SSD heat dissipating member, wherein the SSD heat dissipating member is heat isolated from the CPU heat dissipating member. Providing the industrial person computer with the separate SSD heat dissipating path which is heat isolated from the CPU heat dissipating path and moving the SSD at least partially outside of the main housing, the heat dissipation efficiency and cooling effect of the SSD are improved.

In some embodiments, the SSD heat dissipating member can be spaced apart from the CPU heat dissipating member with a gap, or the SSD heat dissipating member and the CPU heat dissipating member can comprise surfaces contacting each other with a heat insulating member interposed between the surfaces and heat isolating them from each other. The SSD heat dissipating member is heat isolated from the CPU heat dissipating member, and thus the negative effect of the CPU heat dissipating member which has a relatively high temperature on the SSD heat dissipating member which has a relatively low temperature can be eliminated or at least minimized.

In some embodiments, the one panel can comprise a panel body, the pocket defining an opening in the panel body of the one panel, and the SSD heat dissipating member being configured to cover the opening. In some embodiments, the SSD heat dissipating member can comprise a SSD body which is shaped to be complementary to the opening, and in some embodiments, an outer surface of the SSD body of the SSD heat dissipating member away from the internal space can be flush with is an outer surface of the panel body away from the internal space. In this way, the industrial PC has a good appearance.

In some embodiments, the panel body can define a concave corner extending along the opening and defined by a first corner surface and a second corner surface connected with each other, and the SSD body of the SSD heat dissipating member can define a convex edge adapted to be mated with the concave corner and defined by a first edge surface to be pressed against the first corner surface and a second edge surface to face the second corner surface. In particular, the heat insulating member can be provided between the first edge surface and the first corner surface and the second edge surface and the second corner surface can be spaced apart from each other, or the heat insulating member can be provided between the first edge surface and the first corner surface and between the second edge surface and the second corner surface. As such, the SSD heat dissipating member can be heat isolated from the CPU heat dissipating member. The concave corner can be a right-angled or rounded corner and the convex edge can be right-angle right-angled or rounded edge.

In some embodiments, the opening can extend along an entire width of the one panel in the lateral direction and opens at opposite ends in the lateral direction, or the opening can be a closed opening and shaped to be trapezoidal, triangular, pentagonal, hexagonal rectangular, octagonal, oval, or circular. Therefore, the SSD heat dissipating member can have any shape as desired. Further, the heat insulating member can be in a form of film or coating, and the heat insulating member can be made of glass fiber or asbestos.

In some embodiments, the opening can extend along an entire width of the one panel in the lateral direction and divide CPU top fins extending outwardly from the one panel away from the internal space into a first set of fins and a second set of fins, and the SSD heat dissipating member can comprise SSD fins extending outwardly away from the internal space, and wherein the first set of fins and the second set of fins are symmetrical or asymmetrical with regard to the opening; and/or the CPU top fins and/or the SSD fins each include one or more types of fins, the type of fin being associated with parameters of the fin including an extending direction of the fin, a cross-sectional shape of the fin, a cross-sectional dimension of the fin, a spacing between adjacent fins, the arrangement pattern of the fins. Providing the heat dissipating members with fins can increase a surface area for heat dissipation.

In some embodiments, the industrial personal computer can further comprise a motherboard which is secured to the main housing within the internal space, the CPU being secured to the motherboard, and the motherboard being spaced apart from or in contact with a bottom wall of the pocket closest to the motherboard. The SSD can be secured to a motherboard by means of at least one of a SSD mount which extends through a mount hole formed in the bottom wall of the pocket and a fastener which extends through a fastener hole formed in the bottom wall, the mount hole and the fastener hole being provided as separates holes or a single hole which is sized to receive both the SSD mount and the fastener or to receive at least a portion of the SSD. In some embodiments, the SSD can be entirely accommodated in and secured to the pocket with an electrically connecting member extending through the pocket to electrically connect the SSD to an electronic component on the motherboard. Any suitable structure for securing the SSD can be adopted.

In some embodiments, the SSD and a surface of the pocket adjacent to the SSD can be heat isolated from each other by a further heat insulating member interposed therebetween or by a gap separating them apart from each other. Heat isolating the SSD and the CPU heat dissipating member further improves the heat dissipation of the SSD.

The SSD heat dissipating member can be secured to an intermediate component which in turn is secured to the SSD, or the SSD heat dissipating member can be secured to the motherboard with a connecting member which extends through the pocket, or the SSD heat dissipating member can be secured to the CPU heat dissipating member. Any suitable structure of securing the SSD heat dissipating member can be adopted.

In some embodiments, the SSD heat dissipating member can be secured to the bottom wall and/or a side wall of the pocket connecting the bottom wall with a panel body of the one panel. Optionally, one or more studs can extend from the bottom wall, and the SSD heat dissipating member can be secured to the stud with a fastener.

In some embodiments, the CPU heat dissipating path can further comprise a CPU heat transferring member which is configured to be sandwiched and compressed between the CPU and the main housing so as to transfer the heat from the CPU to the main housing. The SSD heat dissipating path can further comprise a SSD heat transferring member which is configured to be sandwiched and compressed between the SSD and the SSD heat dissipating member so as to transfer the heat from the SSD to the SSD heat dissipating member. The SSD heat transferring member and the CPU heat transferring member can be made of heat conductive elastomer, which facilitates heat transfer between respective heat sources and the heat dissipating members.

In some embodiments, the one panel is the top panel, the top panel and two side panels ca be formed as an integral or formed separately and attached to each other, and the entire main housing can be used as the CPU heat dissipating member.

The industrial person computers described herein achieve improved heat dissipation and better cooling effect without compromise of an outer appearance thereof. In particular, separate CPU and SSD heat dissipating paths are provided which are heat isolated from each other, the heat generated by the CPU and the SSD can be dissipated into the ambient air independently and efficiently, and therefore both the CPU and the SSD can be cooled down adequately. Providing the SSD at least partially outside of the main housing is further advantageous for heat dissipation of the SSD. Meanwhile, both the SSD heat dissipating member of the SSD heat dissipating path which is exposed to the ambient air and the CPU heat dissipating member of the CPU heat dissipating path which is exposed to the ambient air are portions of the main housing of the industrial person computer, which provides the industrial person computer with an aesthetically perfect appearance.

Figure 2:
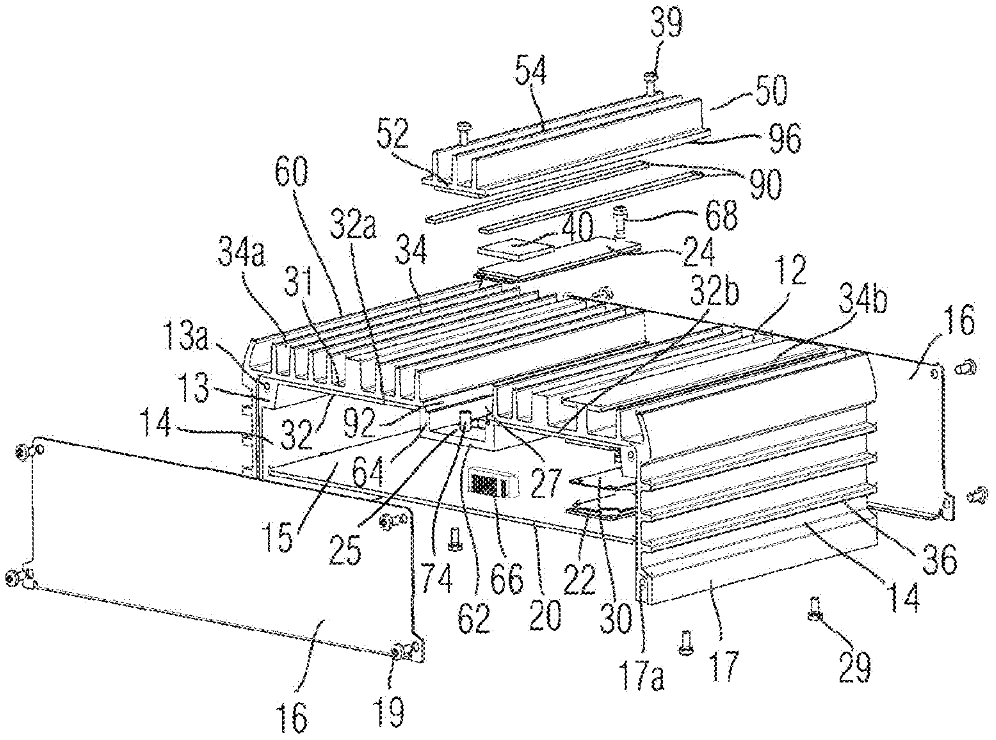
FIG. 2 is an exploded view of the industrial PC in FIG. 1 in which some of internal components are shown.
Figure 3:
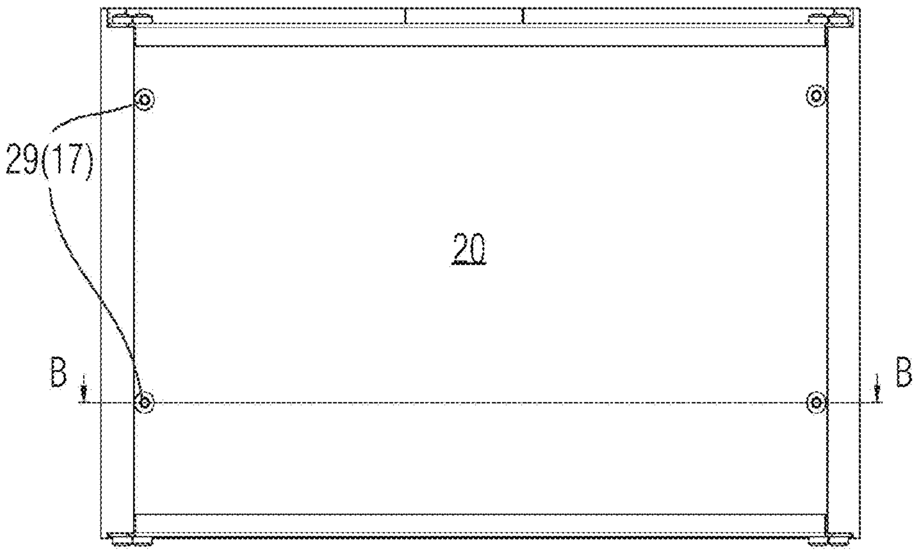
FIG. 3 is a bottom view of the industrial PC of FIG. 1.
Figure 4:
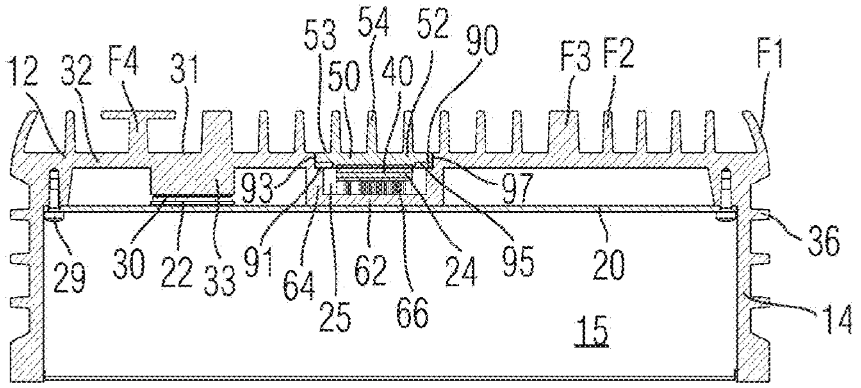
FIG. 4 is a cross-sectional view of the industrial PC taken along a line B-B in FIG. 3.
Figure 5:
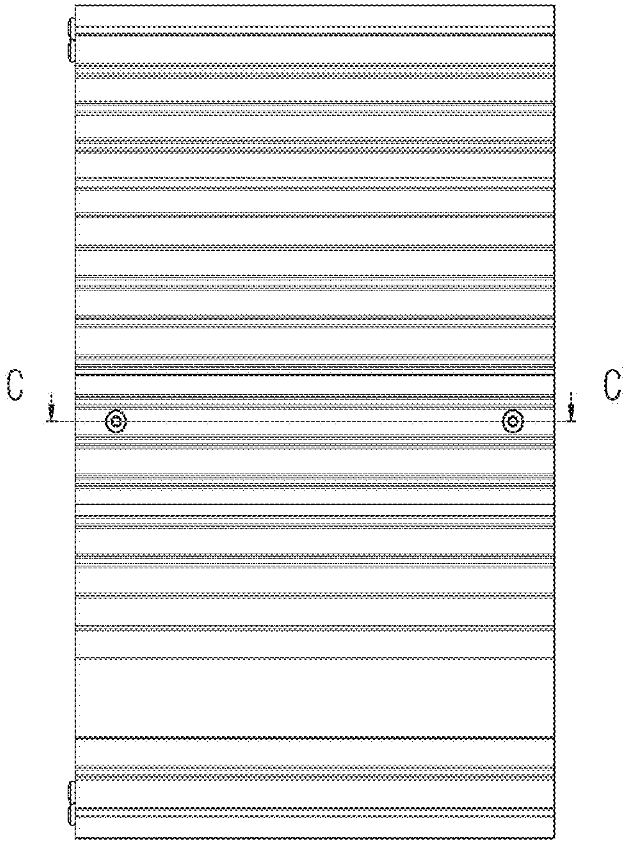
FIG. 5 is a top view of the industrial PC of FIG. 1.
Figure 6:
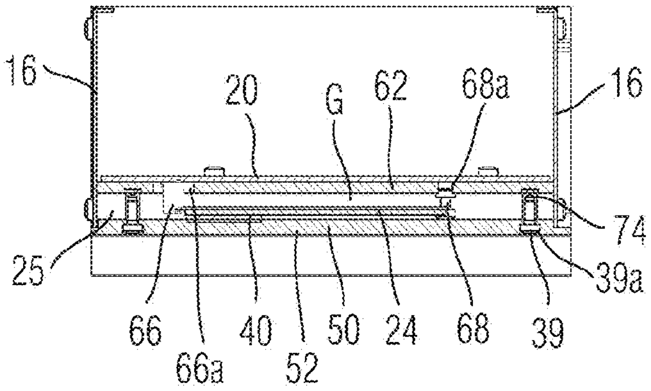
FIG. 6 is a cross-sectional view of the industrial PC taken along a line C-C in FIG. 5.

With reference to the drawings, where like numerals are used to designate like structure throughout the several views, an industrial personal computer (also referred to as "industrial PC" hereinafter) 100 according to an example embodiment of the present disclosure is shown. In the drawings, FIGS. 1 and 2 illustrate an assembled view and an exploded view of an example industrial PC 100 incorporating teachings of the present disclosure, respectively; FIGS. 3 and 5 are a bottom view and a top view of the industrial PC 100, respectively; and FIGS. 4 and 6 are cross-sectional views of the industrial PC 100 taken along a line B-B in FIG. 3 and a line C-C in FIG. 5, respectively.

As shown in FIGS. 1 and 2, generally, the industrial PC 100 comprises an integral main housing 10 and two lateral panels 16 (only one shown in FIGS. 1 and 2) attached to the main housing 10, which collectively define interior for accommodating components necessary for functionalities of the industrial PC 100, including, but not limited to, electronic components, such as a motherboard 20, a CPU 22, a SSD 24 and etc. FIG. 1 illustrates an outer appearance of the industrial PC 100, and FIG. 2 shows the industrial PC 100 in an exploded view, in which only components associated with novel aspects of the disclosure are shown for simplicity purpose. Therefore, components which are not shown in FIG. 2 may be present in some embodiments of the disclosure and the components which are shown in FIG. 2 are not necessary to be present in all embodiments of the disclosure. A bottom panel may or may not be provided for the industrial PC 100 of the disclosure.

In particular, the main housing 10 comprises a top panel 12 and two side panels 14 extending from opposite ends of the top panel 12 in a longitudinal direction L, the top panel 12 and the two side panels 14 being integrally formed as shown in the drawings, or alternatively formed as separates parts and attached to each other, defining an inverted-U-shape profile when viewed in a lateral direction W perpendicular to the longitudinal direction L and defining an internal space 15.

The two lateral panels 16 are attached to opposite side surfaces of the main housing 10 in the lateral direction W to define the interior.

Unless otherwise specified herein, the directional terms "lateral direction" and "longitudinal direction" are used to describe orthogonal directional components as shown in FIG. 1. Further, the terms "inward", "inwardly", "inner" and words of similar import and the terms "outward", "outwardly", "outer" and words of similar import refer to a direction from an ambient toward the internal space 15, and an opposite direction away from the internal space 15, respectively The industrial PC 100 provides two separate heat dissipating paths for two main heat generating components of the industrial PC 100, i.e. a CPU heat dissipating path for cooling the CPU 22 and a SSD heat dissipating path for cooling the SSD 24. The CPU heat dissipating path and the SSD heat dissipating path include a CPU heat dissipating member 60 and a SSD heat dissipating member 50 each exposed to ambient air, respectively, and are configured for dissipating heat generated by the CPU 22 and the SSD 24 into the ambient air independently and directly. Optionally, The CPU heat dissipating path and the SSD heat dissipating path further include a CPU heat transferring member 30 and a SSD heat transferring member 40 each configured for transferring the heat generated by the CPU 22 and the SSD 24 to the CPU heat dissipating member 60 and the SSD heat dissipating member 50, respectively.

The integral main housing 10 acts as the CPU heat dissipating member 60 and the CPU heat dissipating member 60 defines the internal space 15 and constitutes a portion of the outer appearance of the industrial PC 100. However, in a condition that the top panel 12 and the side panels 14 are formed separately, the CPU heat dissipating member 60 may include only one or two of the panels, instead of all the three panels.

The SSD heat dissipating path is configured to be heat isolated from the CPU heat dissipating path in that, almost all components of the SSD heat dissipating path, especially the SSD heat dissipating member 50, are spaced apart from the components of the CPU heat dissipating path, especially the CPU heat dissipating member 60, with a gap or with a heat insulating member interposed between contacting surfaces of the SSD heat dissipating member 50 and the CPU heat dissipating member 60. As a result, effect of the CPU heat dissipating member 60, which has a much higher temperature than the ambient air and than the SSD heat dissipating member 50, on the SSD heat dissipating member 50, which has a relatively lower temperature compared to the CPU heat dissipating member 60, is eliminated or at least minimized. Moreover, the SSD 24, or at least a portion of the SSD 24, is positioned outside of the main housing 10 or the CPU heat dissipating member 60, which further facilitates the heat dissipation of the SSD 24.

To this end, a portion of the CPU heat dissipating member 60 or main housing 10 is recessed toward and into the internal space 15 to form a pocket 25, and the SSD heat dissipating member 50, the optional SSD heat transferring member 40 and at least a portion of the SSD 24 of the SSD heat dissipating path are situated in the pocket 25. As an example, the pocket 25 is formed in the top panel 12. Alternatively, it can be provided in any one of the side panels 14.

With regard to the CPU heat dissipating path, reference can be made to FIGS. 2 and 4. Within the internal space 15 is provided a motherboard 20, and the CPU 22 is secured to the motherboard 20 by surface mount technology, for example, or any other suitable technologies well known in the art. The manner of securing the motherboard 20 to the main housing 10 and the manner of securing the CPU 22 to the motherboard 20 are not emphasis of the disclosure, and only an example is illustrated in the drawings.

Specifically, as shown in FIG. 2, two bosses 13 extend inwardly into the internal space 15 from one or more panels of the main housing 10, and for example from jointing portions of the top panel 12 and the side panels 14 as shown. Two bosses 17 extend outwardly from one or more panels of the main housing 10, and for example from each of the side panels 14. Each of the lateral panels 16 can be secured to the two bosses 13 and the two bosses 17 with fasteners 19. Unless otherwise specifically indicated, the term "fastener" used in the disclosure can refer to a bolt, a screw, a rivet or any other suitable fastening element well known in the art. As shown in FIGS. 2, holes 13*a* and 17*a* for the fasteners 19 are provided and extend into the corresponding bosses 13 and 17 in the lateral direction W. The motherboard 20 is also secured to bosses 13 by means of fasteners 29. For example, as shown in FIGS. 3 and 4, at each end of the motherboard 20 in the longitudinal direction L, the motherboard 20 is secured to the corresponding boss 13, at two positions 17 along a width of the boss 13 in the lateral direction W. Each of the bosses 13 can extend along an entire width of the main housing 10 or comprise several segments for securing the lateral panels 16 and the motherboard 20.

At a position where the CPU 22 is secured or fixed to the motherboard 20, a protrusion 33 (FIG. 4) is provided and extends inwardly from the top panel 12 toward the motherboard 20 to an extent so that, in the assembled state, the CPU heat transferring member 30 is sandwiched and compressed tightly between the CPU 22 and the protrusion 33 of the top panel 12, which is part of the CPU heat dissipating member 60, forming the CPU heat dissipating path. As such, a sufficient heat transfer from the CPU 22 to the CPU heat dissipating member 60 is ensured. It should be understood for a skilled in the art that the protrusion 33 may be omitted in some embodiments of disclosure as long as the sufficient heat transfer is ensured.

The CPU heat transferring member 30 can be made of a material with a high heat conductivity and may be made of a heat conductive elastomer. In some embodiments, the CPU heat transferring member 30 is made of heat conductive silicon rubber so that, in the assembled industrial PC 100, the CPU heat transferring member 30 is compressed and deformed between the CPU 22 and the top panel 12. As such, surface bonding is provided between the CPU 22 and the CPU heat transferring member 30 and between the CPU heat transferring member 30 and the top panel 12. It should be understood that adopting the CPU heat transferring member 30 with elasticity is not the only way to transfer the heat generated by the CPU 22 to the main housing 10.

Also referring to FIG. 6 in combination, the SSD heat dissipating path will be described in detail, and in the illustrated embodiment, it is entirely situated in the pocket 25. In some embodiments, all components of the SSD heat dissipating path, including the SSD 24, the SSD heat transferring member 40 and the SSD heat dissipating member 50, are spaced apart from the main housing 10 by a gap to ensure that no heat exchange occurs therebetween. In some embodiments, a heat insulating member is interposed or provided between any component of the SSD heat dissipating path and an adjacent surface of the main housing 10 which will otherwise contact each other. The heat insulating member used in the context can be in the form of film or coating. In some embodiments, the heat insulating member is flexible, and a rigid heat insulating member is also contemplated. Possible materials that can be used for the heat insulating member include, but not limited to, glass fibre and asbestos.

As shown in the drawings, the pocket 25 extends along an entire width of the top panel 12 in the lateral direction W, opening at opposite ends in the lateral direction W. The pocket 25 further defines an opening 27 (FIG. 2) in a panel body 32 of the top panel 12, and comprises a bottom wall 62 and two side walls 64 opposite to each other for connecting the bottom wall 62 to the panel body 32 of the top panel 12.

As shown in FIG. 6, the SSD 24 in the pocket 25 is secured to the motherboard 20 in the internal space 15 by means of a SSD mount 66 which extends through a mount hole 66*a* formed in the bottom wall 62. Further, a fastener 68 is provided to pass through a fastener hole 68*a* formed in the bottom wall 62 to fasten the SSD 24 to the motherboard 20. Clearance fit is provided between the SSD mount 66 and the mount hole 66*a* and/or between the fastener 68 and the fastener hole 68*a* to minimize any possible heat transfer between the main housing 10 and the SSD 24. Any other suitable securing manner of the SSD 24 to the motherboard 20 can be contemplated.

Also in order to avoid any undesired heat transfer, a gap G (FIG. 6) is provided between the SSD 24 and the bottom wall 62 of the pocket 25. In some embodiments, a heat insulating member can be provided between the SSD 24 and/or the SSD heat transferring member 40 and the bottom wall 62 and/or the side walls 64 of the pocket 25, as desired.

The SSD heat dissipating member 50 which is independent from the CPU heat dissipating member 60 or the main housing 10 can be located within the pocket 25 while being exposed to the ambient air. The SSD heat dissipating member 50 can be fitted in the opening 27 of the top panel 12 to cover it with their profiles complementary to each other, and an outer surface 53 of a SSD body 52 of the SSD heat dissipating member 50 away from the internal space 15 can be flush or substantially flush with an outer surface 31 (FIG. 4) of the top panel 12, as shown in FIG. 4, which provides the industrial PC 100 with an aesthetically continuous appearance. That is to say, the SSD heat dissipating member 50 also forms a portion of the outer appearance of the industrial PC 100. The SSD body 52 of the SSD heat dissipating member 50 and the panel body 32 of the top panel 12 may have substantially the same thickness.

In some embodiments which are not shown in the drawings, in an assembled sate, the SSD body 52 of the SSD heat dissipating member 50 can be entirely spaced apart from the panel body 32 of the top panel 12 physically with gap without any contacting points or surfaces therebetween. As an example, the SSD body 52 has the same shape as the opening 27 but has an outer dimension smaller than an inner dimension of the opening 27. As another example, the SSD body 52 is not co-planar with the panel body 32 to form a gap therebetween.

In some embodiments, there are some contacting points or surfaces between the SSD heat dissipating member 50 and the main housing 10 (in particular between the SSD heat dissipating member 50 and the portions of the top panel 12 defining the opening 27), but heat insulating members are provided between them at the contacting points or surfaces to space them apart from each other.

With reference to FIGS. 4 and 6, the SSD heat dissipating member 50 is shown in its assembled state, in which the SSD heat dissipating member 50 is secured to bottom wall 62 of the pocket 25, and its SSD body 52 is fitted in the opening 27 and coplanar with the panel body 32.

In particular, one or more studs 74 (two studs 74 shown in FIGS. 2 and 6) extend outwardly from the bottom wall 62 of the pocket 25 away from the internal wall 15, and fasteners 39 pass through holes 39*a* (counter bores as in FIG. 6) formed in the SSD heat dissipating member 50 into corresponding holes (not identified) formed in the studs 74, securing the SSD heat dissipating member 50 to the bottom wall 62 and thus to the top panel 12. The studs 74 are dimensioned so that, when the SSD heat dissipating member 50 is secured to the bottom wall 62 of the pocketing 25 of the top panel 12, the SSD heat transferring member 40 is compressed and deformed between the SSD 24 and the SSD heat dissipating member 50 so as to establish a good heat transfer from the SSD 24 to the SSD heat dissipating member 50. It is noted that the above description about the CPU heat transferring member 30 is also applied to the SSD heat transferring member 40.

The panel body 32 of the top panel 12 comprises concave corners 92 (FIG. 2) defining the opening 27, each of which is defined by a first corner surface 91 (FIG. 4) and a second corner surface 93 (FIG. 4) connected with each other, and the SSD body 52 of the SSD heat dissipating member 50 defines convex edges 96 (FIG. 2) each of which is adapted to be mated with the concave corner 92 and defined by a first edge surface 95 (FIG. 4) to be pressed against the first corner surface 91 and a second edge surface 97 (FIG. 4) to face the second corner surface 93.

A heat insulating member 90 is provided between the first edge surface 95 and the first corner surface 91 which otherwise will contact each other. The second edge surface 97 and the second corner surface 95 can be spaced apart from each other or can be provided with another heat insulating member therebetween. According to actual demands, the concave corner 92 can be a right-angled or rounded corner and the convex edge 96 can be a right-angled or rounded edge accordingly.

With the structure shown and described as above, the SSD heat dissipating member 50 is heat isolated from the CPU heat dissipating member or main housing 10, and the object of eliminating or minimizing the effect of CPU heat dissipation on SSD heat dissipation and thus improving heat dissipating efficiency and cooling effect of the SSD is achieved.

As the heat dissipating members in the industrial PC 100, both the main housing 10 and the SSD heat dissipating member 50 can be made of aluminum or any suitable materials well known in the art. In addition, it can also be seen from the drawings that all these heat dissipating members are provided with heat dissipating fins extending outwardly into the ambient air so as to increase a surface area for heat dissipation. In this regard, the SSD heat dissipating member 50 has a general similar structure as the CPU heat dissipating member 60.

Typically, the main housing 10 as the CPU heat dissipating member 60 comprises CPU (heat dissipating) fins, including CPU top fins 34 extending outwardly from the panel body 32 and CPU side fins 36 on the side panels 14 extending outwardly. Due to the presence of the pocket 25, the panel body 32 of the top panel 12 is divided into a first portion 32*a* and a second portion 32*b* and the CPU top fins 34 are divided into a fist set of top fins 34*a* of the first portion 32*a* and a second set of top fins 34*b* of the second portion 32*b*. Similarly, the SSD heat dissipating member 50 comprises SSD (heat dissipating) fins 54 extending from the SSD body 52 outwardly. The first set of top fins 34*a* and the second set of top fins 34*b* can be symmetrical or asymmetrical (as shown) with regard to the opening 27 of the pocket 25.

Each of the CPU top fins 34, the side fins 36 and the SSD fins 54 may have different types of fins. The types of fins are associated with parameters of fins, including, but not limited to, an extending direction of fins, the number of fins, a cross-sectional shape of fins, a cross-sectional dimension of fins, periodicity of fins arrangement; and a spacing between adjacent fins etc. As an example, in the illustrated embodiment, four types of fins are shown for the CPU top fins 34, a first type of fins F1, a second type of fins F2, a third type of fins F3 and a fourth type of fins F4. Fins can extend linearly as shown or curvedly in their extending directions parallel to the lateral direction W. Examples of possible cross-sectional shapes of fins in a plane perpendicular to the extending direction of the fin include, but not limited to, rectangular, triangular, trapezoidal and curved. It can be understood that the structure about the heat dissipating fins is not limited to the details shown in the drawings.

The example industrial PC shown in the drawing has been described as an example mode known to the skilled in the art for carrying out the teachings of the present disclosure. Providing the industrial PC with separate heat dissipating paths for the CPU and the SSD with the CPU heat dissipating member and the SSD heat dissipating member both exposed to the ambient air, the heat generated by the CPU and the SSD can be dissipated into the ambient air independently and directly. The fact that the two heat dissipating paths, in particular the CPU heat dissipating member and the SSD heat dissipating member, are heat isolated from each other eliminates or at least minimizes the effect of the CPU heat dissipation on the SSD heat dissipation and thus substantially improves the cooling effect of the SSD. The fact that the SSD heat dissipating member is shaped to be complementary to the opening in the CPU heat dissipating member with their outer surfaces flush with each other and, the heat dissipating fins of the CPU heat dissipating member and those of the SSD heat dissipating member may be arranged in a desired pattern provides the industrial PC with aesthetically ideal appearance.

Upon reading the foregoing description, variations of the embodiment may become apparent to those of ordinary skill in the art. For example, opposed to providing the pocket with opposite ends in the lateral direction W, the pocket for receiving the components of the SSD heat dissipating path can be formed as a closed opening, and the concave corner 92 and the convex edge 96 can extend entirely around the opening. The opening may have any suitable shape, and for example, the opening, as well as the SSD heat dissipating member, may be polygonal, such as triangular, rectangular, trapezoidal, pentagonal, hexagonal, quadrilateral or octagonal, or oval, or circular. In some embodiments, It can be contemplated that, different from the pocket defined by the planar bottom wall and the planar side walls as shown, it can be defined by one or more curved walls.

For example, instead of being secured to the bottom wall of the pocket, the SSD heat dissipating member can be secured to the side walls of the pocket, or to both the bottom wall and the side walls. It is also contemplated that the SSD heat dissipating member can be secured to any accessory fixed to the SSD, or can be secured to the motherboard similar to the SSD. As an example, a connecting member and/or a fastener extend through the bottom wall of the pocket to secure the SSD heat dissipating member to the motherboard. Any other arrangements for securing the SSD heat dissipating member can be designed under the premise of substantially no heat exchange between the SSD heat dissipating member and the CPU heat dissipating member.

Further, the manner of securing the SSD is not limited that described above. The SSD can be secured to a motherboard, for example by means of one or both of the SSD mount and the fastener extending through the bottom wall or any other portion of the pocket, and the mount hole for SSD mount and the fastener hole for the fastener can be provided as separates holes or a single hole which is sized to receive both of them. Alternatively, a single hole can be provided to receive a portion of the SSD. It is also contemplated that the SSD is entirely accommodated in and secured to the pocket. For example, the SSD can be secured to the bottom wall and/or the side walls of the pocket, with one or more electrically connecting members extending through the pocket to electrically connect the SSD to an electronic component on the motherboard.

In some embodiments, for example the one shown in the drawings, the top panel 12 and the side panels 14 are formed as an integral component, the whole main housing 10 functions as the CPU heat dissipating member, and the pocket in which the SSD heat dissipating member is situated can be provided in any of these panels. However, in some embodiments where the top panel 12 and the side panels 14 of the main housing 10 are formed as separate parts, the CPU heat dissipating member can include only one or two panels of the top panel 12 and the side panels 14.

It will be appreciated that the use of the terms “a”, “an”, “the” and similar referents in the context of describing the disclosure (especially in the context of the following claims) is to be construed to cover both the singular and the plural, unless otherwise indicated herein or clearly contradicted by context. The terms “comprising”, “having”, and “including” are to be construed as open-ended terms (i.e., meaning “including, but not limited to,”) unless otherwise noted. The use of exemplary language (e.g., "such as") is intended merely to better illuminate the disclosure and does not pose a limitation on the scope of the disclosure unless otherwise claimed. No language in the specification should be construed as indicating any non-claimed element as essential to the practice of the teachings herein.

It will be further appreciated that terms such as "first", "second", "third", and the like are used herein to differentiate certain structural features and components for the non-limiting, illustrative purposes of clarity and consistency.

The example configuration and several alternatives have been discussed in the foregoing the description. However, configurations discussed herein are not intended to be exhaustive or limit the teachings of the disclosure to any particular form. The terminology which has been used is intended to be in the nature of words of description rather than of limitation. Many modifications and variations are possible in light of the above teachings may be practiced otherwise than as specifically described.

What is claimed is:

1. An industrial personal computer comprising:

a main housing exposed to ambient air comprising a top panel and two side panels extending from opposite ends of the top panel in a longitudinal direction to define an inverted-U-shape profile when viewed in a lateral direction perpendicular to the longitudinal direction and define an internal space, wherein at least one panel of the top panel and the two side panels defines a central processing unit (CPU) heat dissipating member having a portion recessed into the internal space to form a pocket;

a CPU disposed in the internal space, wherein heat generated by the CPU transfers to the CPU heat dissipating member along a CPU heat dissipating path and thereby into the ambient air from the CPU heat dissipating member;

a solid state drive (SSD) at least partially positioned in the pocket; and a SSD heat dissipating member positioned in the pocket and exposed to the ambient air, wherein heat generated by the SSD transfers to the SSD heat dissipating member along a SSD heat dissipating path and directly into the ambient air from the SSD heat dissipating member;

wherein the SSD heat dissipating member is heat isolated from the CPU heat dissipating member.

2. The industrial personal computer according to claim 1, wherein the SSD heat dissipating member is spaced apart from the CPU heat dissipating member by a gap, or the SSD heat dissipating member and the CPU heat dissipating member comprise respective surfaces not in contact with each other but both in contact with a heat insulating member interposed between the surfaces and heat isolating them from each other.

3. The industrial personal computer according to claim 2, wherein:

the at least one panel comprises a panel body;

the pocket defines an opening in the panel body of the at least one panel; and the SSD heat dissipating member covers the opening.

4. The industrial personal computer according to claim 3, wherein the SSD heat dissipating member comprises a SSD body shaped complementary to the opening.

5. The industrial personal computer according to claim 4, wherein an outer surface of the SSD body of the SSD heat dissipating member away from the internal space is flush with is an outer surface of the panel body away from the internal space.

6. The industrial personal computer according to claim 4, wherein the panel body defines a concave corner extending along the opening and defined by a first corner surface and a second corner surface connected with each other, and the SSD body of the SSD heat dissipating member defines a convex edge adapted to be mated with the concave corner and defined by a first edge surface to be pressed against the first corner surface and a second edge surface to face the second corner surface.

7. The industrial personal computer according to claim 6, wherein:

the heat insulating member is disposed between the first edge surface and the first corner surface; and the second edge surface and the second corner surface are spaced apart from each other, or the heat insulating member is disposed between the second edge surface and the second corner surface.

8. The industrial personal computer according to claim 6, wherein the concave corner is a right-angled or rounded corner and the convex edge is a right-angled or rounded edge.

9. The industrial personal computer according to claim 3, wherein:

the opening extends along an entire width of the at least one panel in the lateral direction and opens at opposite ends in the lateral direction; or the opening is trapezoidal, triangular, pentagonal, hexagonal rectangular, octagonal, oval, or circular.

10. The industrial personal computer according to claim 3, wherein:

the heat insulating member comprises a film or coating; and the heat insulating member comprises glass fiber or asbestos.

11. The industrial personal computer according to claim 3, wherein:

the opening extends along an entire width of the one panel in the lateral direction and divides CPU top fins extending outwardly from the at least one panel away from the internal space into a first set of fins and a second set of fins;

the SSD heat dissipating member comprises SSD fins extending outwardly away from the internal space;

the first set of fins and the second set of fins are symmetrical or asymmetrical with regard to the opening; and/or the CPU top fins and/or the SSD fins each include one or more types of fins, the type of fin being associated with parameters of the fin including an extending direction of the fin, a cross-sectional shape of the fin, a cross-sectional dimension of the fin, a spacing between adjacent fins, and the arrangement pattern of the fins.

12. The industrial personal computer according to claim 1, further comprising a motherboard secured to the main housing within the internal space;

wherein the CPU is secured to the motherboard; and the motherboard is spaced apart from or in contact with a bottom wall of the pocket closest to the motherboard.

13. The industrial personal computer according to claim 12, wherein:

the SSD is secured to the motherboard by at least one of a SSD mount extending through a mount hole formed in the bottom wall of the pocket and a fastener extending through a fastener hole formed in the bottom wall, the mount hole and the fastener hole comprising separate holes or a single hole sized to receive both the SSD mount and the fastener or to receive at least a portion of the SSD; or the SSD is entirely accommodated in and secured to the pocket with an electrically connecting member extending through the pocket to electrically connect the SSD to an electronic component on the motherboard.

14. The industrial personal computer according to claim 13, wherein the SSD and a surface of the pocket adjacent to the SSD are heat isolated from each other by a further heat insulating member interposed therebetween or by a gap separating them apart from each other.

15. The industrial personal computer according to claim 12, wherein the SSD heat dissipating member is secured to an intermediate component which in turn is secured to the SSD, or the SSD heat dissipating member is secured to the motherboard with a connecting member which extends through the pocket.

16. The industrial personal computer according to claim 12, wherein the SSD heat dissipating member is secured to the CPU heat dissipating member.

17. The industrial personal computer according to claim 16, wherein the SSD heat dissipating member is secured to the bottom wall and/or a side wall of the pocket connecting the bottom wall with a panel body of the at least one panel.

18. The industrial personal computer according to claim 17, wherein one or more studs extend from the bottom wall, and the SSD heat dissipating member is secured to the studs with a fastener.

19. The industrial personal computer according to claim 1, wherein:

the CPU heat dissipating path further comprises a CPU heat transferring member sandwiched and compressed between the CPU and the main housing to transfer the heat from the CPU to the main housing; and the SSD heat dissipating path further comprises a SSD heat transferring member sandwiched and compressed between the SSD and the SSD heat dissipating member to transfer the heat from the SSD to the SSD heat dissipating member; and the SSD heat transferring member and the CPU heat transferring member comprise heat conductive elastomer.

20. The industrial personal computer according to claim 1, wherein:

the at least one panel is the top panel;

the top panel and two side panels are formed as an integral or formed separately and attached to each other; and the entire main housing provides the CPU heat dissipating member.

* * * * *